(12) United States Patent
Dietrich et al.

(10) Patent No.: US 6,614,700 B2
(45) Date of Patent: Sep. 2, 2003

(54) CIRCUIT CONFIGURATION WITH A MEMORY ARRAY

(75) Inventors: Stefan Dietrich, Türkenfeld (DE); Peter Schrögmeier, München (DE); Sabine Kieser, Hausham (DE); Christian Weis, Germering (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/116,826

(22) Filed: Apr. 5, 2002

(65) Prior Publication Data

US 2002/0145923 A1 Oct. 10, 2002

(30) Foreign Application Priority Data

Apr. 5, 2001 (DE) .......................................... 101 16 914

(51) Int. Cl.$^7$ ................................................. G11C 7/00
(52) U.S. Cl. ................... 365/194; 365/189.05; 365/233
(58) Field of Search ........................... 365/194, 189.05, 365/233

(56) References Cited

U.S. PATENT DOCUMENTS 4,727,519 A 2/1988 Morton et al.
5,964,884 A 10/1999 Partovi et al.
6,359,815 B1 * 3/2002 Sato et al. .................. 365/194

* cited by examiner

Primary Examiner—Huan Hoang
(74) Attorney, Agent, or Firm—Laurence A. Greenberg; Werner H. Stemer; Ralph E. Locher

(57) ABSTRACT

The circuit configuration has a memory array, a memory access controller, a control unit, and an input/output circuit. The control unit outputs a control signal simultaneously to the memory access controller and to the input/output circuit. When the control signal is received, the input/output circuit outputs data to the memory access controller via the data bus. When the control signal is received, the memory access controller stores the data present on the data bus in memory cells of the memory array. Owing to different geometric arrangements and different electrical capacitances, differences in propagation time of the control signals may occur on the path from the control unit to the memory access controller and from the control unit to the input/output circuit. For this purpose, a delay circuit or delay line is provided on the signal path to the memory access controller which brings about a delay of the control signal. This enables precise synchronization of the writing of data into the memory array.

8 Claims, 3 Drawing Sheets

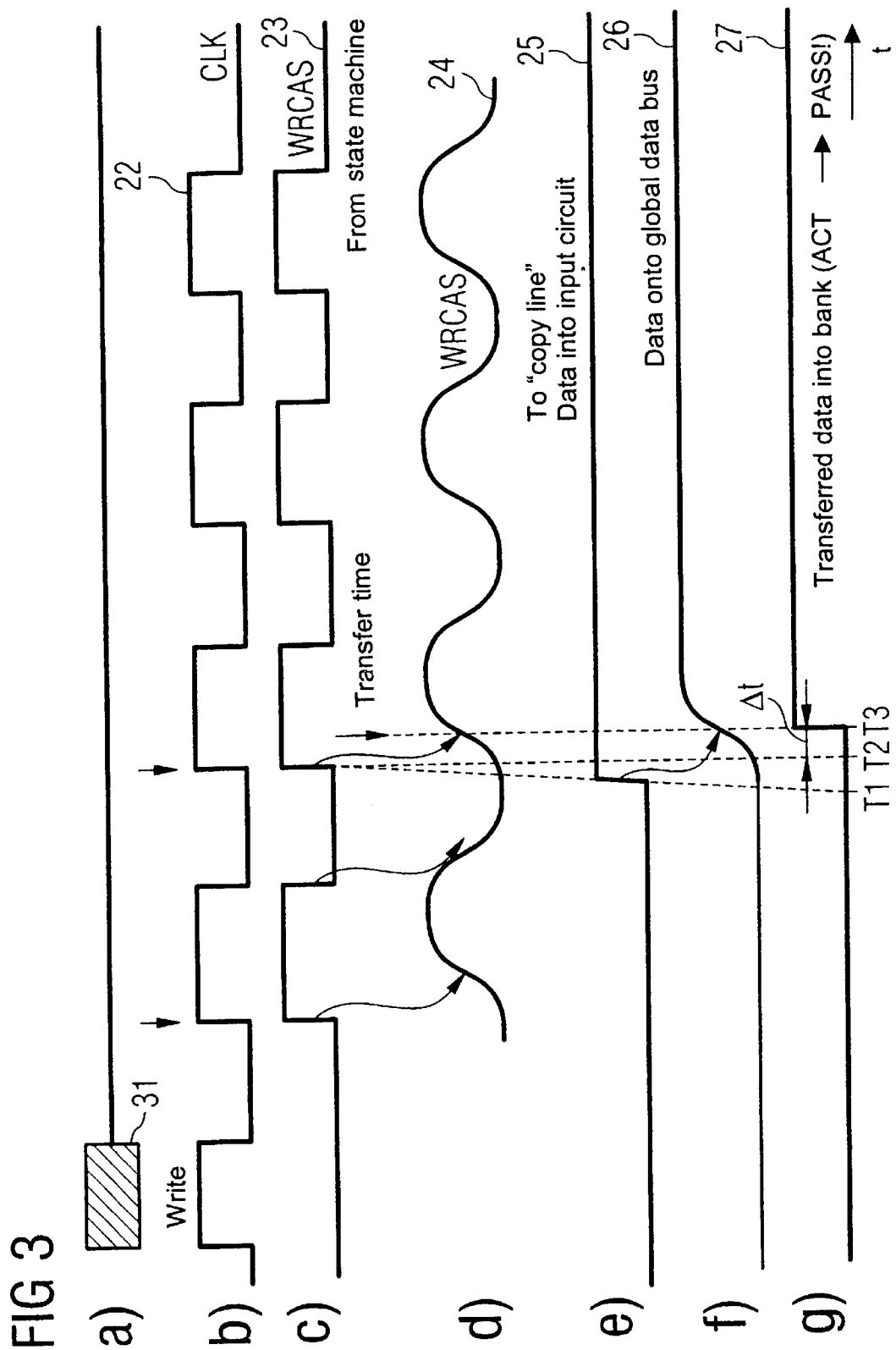

CIRCUIT CONFIGURATION WITH A MEMORY ARRAY

BACKGROUND OF THE INVENTION

FIELD OF THE INVENTION

The invention relates to a circuit configuration with a memory array, a memory access controller assigned to the memory array, a control unit, and an input/output circuit. The memory access controller is connected to the input/output circuit via a data bus. The control unit is connected to the input/output circuit via a first control line and to the memory access controller via a second control line. The control unit outputs a control signal simultaneously to the input/output circuit and to the memory access controller In memory technology, semiconductor memories are used which have a memory array with a multiplicity of memory cells. Each individual memory cell can be accessed by means of a memory access controller for writing or reading. The memory access controller is connected via a data bus to an input/output circuit via which data is output onto the data bus or read out from the data bus. In order to control the writing and reading operations, a control unit is provided which is connected to the memory access controller and the input/output circuit via a control line. Corresponding circuit arrangements are provided, in particular, in dynamic memories with random access (DRAM). Because the memory capacitances of the dynamic memories are increasing further, this has had the effect that, even though technology is becoming more miniaturized, the surface of a memory module is becoming larger. In addition, the operating frequencies are increasing so that the requirements made in terms of timing precision of control signals and of data signals are increasing. Furthermore, owing to lines which are becoming longer, the signal edges of global signals are becoming increasingly flat owing to technological properties.

In addition, owing to the size of the memory module, differing lengths of control lines occur between a central control unit and a memory array or between the central control unit and the input/output circuit because the memory arrays are arranged around the control unit and the input/output unit is arranged in an edge region of the memory module. The control signals of the central control unit must, however, both be supplied to the memory array in a clock-synchronous fashion and be output by the input/output circuit in a clock-synchronous fashion. However, because the control lines have differing lengths, synchronization problems may occur because the propagation times are different and there are different line capacitances on the control lines owing to the lines with different lengths. As a result, the signal edges of the control signals for the memory access controller and for the input/output circuit have different degrees of steepness.

SUMMARY OF THE INVENTION

It is accordingly an object of the invention to provide a circuit configuration with a control unit which overcomes the above-mentioned disadvantages of the heretofore-known devices and methods of this general type and wherein synchronization problems between components that are actuated by the control unit are reduced.

With the foregoing and other objects in view there is provided, in accordance with the invention, a circuit configuration, comprising:

a memory array and a memory access controller connected to the memory array;

an input/output circuit connected to the memory access controller through a data bus;

a control unit connected to the input/output circuit via a first control line and to the memory access controller via a second control line, the control unit outputting a control signal simultaneously to the input/output circuit and to the memory access controller; and a delay circuit connected in the second control line, the delay circuit delaying the control signal by a given delay time.

An advantage of the invention is that a delay circuit, which brings about a delay of the control signal is provided in a control line. Owing to the delay in a control line, the timing of a control signal is adapted to the timing of a control signal of a second control line. In this way, synchronization of the control signals of the two components is achieved independently of the length of the control lines of the components to be controlled.

A further advantage of the invention is that the delay circuit has a predetermined line capacitance. The overall capacitance of the delay circuit and of the control line connected to the delay circuit is preferably defined in such a way that the overall capacitance is equal to the capacitance of the second control line. In this way, the delay circuit equalizes the capacitances of the first and the second control lines. As a result, the signal edges of the control signals which are transmitted via the first and second control lines are made identical. Additional precise matching of the time arrival of the control signal is thus made possible.

In accordance with an added feature of the invention, the second control line and the data bus are constructed with a substantially identical length.

In accordance with an added feature of the invention, the delay circuit includes a copy circuit effecting a delay of the control signal, the copy circuit is substantially identical in design to signal paths of the input/output circuit at least in components through which the control signal and the data in the input/output circuit pass, and which effect a delay between a time at which the control signal arrives at the input/output unit and a time at which data is output by the input/output unit upon receiving a control signal.

In accordance with an added feature of the invention, the delay time is approximately the time which the input/output circuit takes, after receiving the control signal, to output data onto the data bus.

In accordance with another feature of the invention, the copy circuit comprises a plurality of components corresponding to components of the input/output circuit defining signal paths thereof.

In accordance with a further feature of the invention, the copy circuit is manufactured using a technology equalling a technology in which the input/output circuit is manufactured.

In accordance with an additional feature of the invention, the second control line and the data bus are identical in terms a technology used to produce the second control line and the data bus.

In other words, the various advantageous embodiments of the invention provide for the following: In one preferred embodiment, a copy line is provided which is connected to the delay circuit. The copy line is constructed in the same way as the data line, and the data is fed from the input/output circuit to the memory access controller. In this way, the control signal experiences the same delay and the same capacitance as the data. Precise synchronization of the arrival of the control signal at the memory access controller and the arrival of the data can thus be achieved.

In a further advantageous embodiment, the delay circuit is constructed using the same technology as the signal path over which a control signal in the input/output circuit runs and causes data to be output onto the data bus. At least the components which bring about a delay of the control signal in the input/output circuit and a delay of the outputting of the data in the input/output circuit onto the data bus are even identical. This ensures that the delay between the arrival of the control signal at the input/output circuit and the outputting of the data from the input/output circuit is equal to the delay which a control signal will maintain in the first control line. The use of the same technology ensures that the matching of the timing is maintained even when the technology has changed. In this way, the chronological effect of the delay circuit is ensured independently of the selected technology which is used in the manufacture of the memory module.

In accordance with a concomitant feature of the invention, the delay circuit is a flip-flop having an input connected through to an output. In this simple embodiment, the delay circuit is constructed in the form of a connected-through flip-flop. A connected-through flip-flop forms essentially the delay which is required for the switching operation of the control signal in the input/output circuit in order to transmit data from the input/output circuit to the data bus after the control signal is input.

Other features which are considered as characteristic for the invention are set forth in the appended claims.

Although the invention is illustrated and described herein as embodied in a circuit configuration with a memory array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a timing diagram detailing to the chronological position of the control signal and of the data.

DESCRIPTION OF THE PREFERRED EMBODIMENTS

Figure 1:
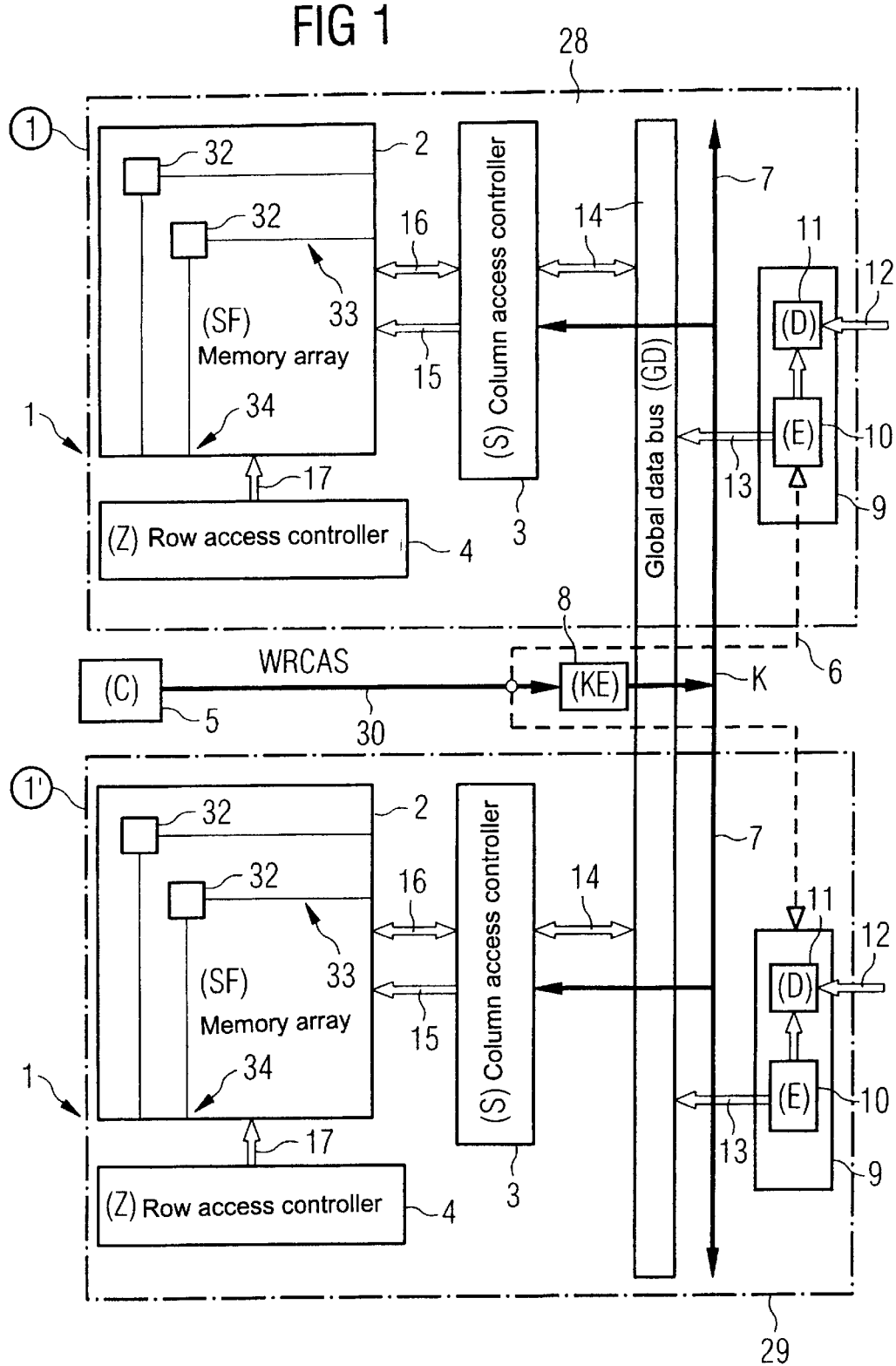
FIG. 1 is a schematic block diagram of a detail of a dynamic memory module.

Referring now to the figures of the drawing in detail and first, particularly, to FIG. 1 thereof, there is shown a detail of a circuit configuration of a dynamic memory module 1. The dynamic memory module 1 has a central control unit 5 which is connected to a plurality of memory blocks 28, 29. The memory blocks 28, 29 are of substantially identical construction and the invention is explained with reference to a first memory block 28. The first memory block 28 has a first memory array 2 or memory field 2, a memory access controller with a row access controller 4 and a column access controller 3. Memory cells 32, which can be accessed via column lines 33 and row lines 34, are arranged in the first memory array 2. Furthermore, an input/output circuit 9 is provided in the first memory block 28. The input/output circuit 9 has an input interface 12 via which data can be written into an input memory 11 of the input/output circuit 9.

A global data bus 14 which is connected to a plurality of memory blocks 28, 29 is provided. The global data bus 14 is connected to the memory access controller 3 and to the input/output circuit 9 via an output interface 13. The row access controller is connected via a second selection line 17 to the memory array 2. The column access controller 3 is connected via a first selection line 15 and via data lines 16 to the memory array 2. The control unit 5 has an output 30 which is connected, on the one hand, to a delay circuit 8 and, on the other hand, to a first control line 6. The first delay circuit 8 is connected by an output to a second control line 7. The second control line 7 is routed transversely across the first and second memory blocks 28, 29. The second control line 7 is connected to the first access controller 3. The first control line 6 is connected to a switching unit 10 of the input/output circuit 9. The switching unit 10 is connected to the input memory 11 via a data line and to the global data bus 14 via the output interface 13.

The second control line 7 is also referred to as a copy line and is embodied essentially in the same way as the global data bus 14. Here, the second control line 7 has essentially the same length, and preferably the same geometric arrangement, as the global data bus 14. In addition, in one preferred embodiment, the second control line 7 is embodied using the same technology as the data bus 14. Here, the metalization line of the second control line 7 is preferably fabricated from the same material as a metalization line of the global data bus 14. In addition, the metalization line of the second control line 7 is applied to the same material as the metalization line of the data bus 14. The object of the identical construction of the second control line 7 to that of the data bus 14 is an embodiment which is virtually identical with respect to the propagation time and capacitance and which is independent of the technology used. This ensures that data which is output by the input/output circuit 9 via the global data bus 14 and routed to the column access controller 3 takes essentially the same time as a control signal which is output to the first access controller 3 by the delay circuit 8 via the second control line 7. In this way, synchronization is achieved between the propagation time of the data between the input/output circuit 9 and the column access controller 3, and the control signal between the delay circuit 8 and the column access controller 3.

The delay circuit 8 preferably has the same components which the switching unit 10 has and which bring about a delayed outputting of data from the input memory 11 onto the data bus 14 after the inputting of the control signal at the switching unit 10. Not only are the components preferably identical but the same technology is also preferably used for the construction of the delay circuit 8 as for the construction of the switching unit 10. The object of the identical embodiment of the delay circuit 8 is to simulate the propagation time which passes between the time at which a control signal arrives at the switching unit 10 and the data of the input memory 11 is output by the switching unit 10 onto the data bus 14 via the output interface 13. Using the same technology ensures that when the technology of the circuit [sic] unit 10 changes the technology for the delay circuit 8 is also changed and the propagation time is thus kept identical.

The method of operation of the configuration of FIG. 1 is explained in more detail below: if data is to be written into memory cells of the memory array 2, the row addresses of the memory cells into which data is to be written are defined by the row access controller 4, and the column addresses of the memory cells into which data is to be written are defined by the column access controller 3. The writing operation is started by an external write signal, which is received by the control unit 5. In addition, data is read into the input memory 11 as a function of the external write signal via the input interface 12. At a predetermined interval from the write signal, preferably two clock periods after the write signal, the control unit 5 outputs a control signal (WRCAS) via the output 30. The control signal is fed, on the one hand, to the delay circuit 8 and, on the other hand, via the first control line 6 to the switching unit 10. In the delay circuit 8, the control signal is stored for a defined time period and is then output to the second control line 7. The control signal is fed to the column access controller 3 via the second control line 7.

In parallel thereto, the control signal switches, after being input into the switching unit 10, a connection between the input memory 11 and the output interface 13 so that the data stored in the input memory 11 is output onto the data bus 14. The data is fed via the data bus 14 to the column access controller 3. The signal paths of the control signal and the signal paths of the data are adapted to one another in such a way that first the data is present at the column access controller 3 and then the control signal is fed to the column access controller 3. When the column access controller 3 receives the control signal, the column access controller 3 loads the data present at the data bus 14 into the selected memory cells via the data lines 16. So that the data is correctly loaded into the memory cells, it is necessary for the data to be present at the column access controller 3 before the control signal is applied to the column access controller.

Figure 2:
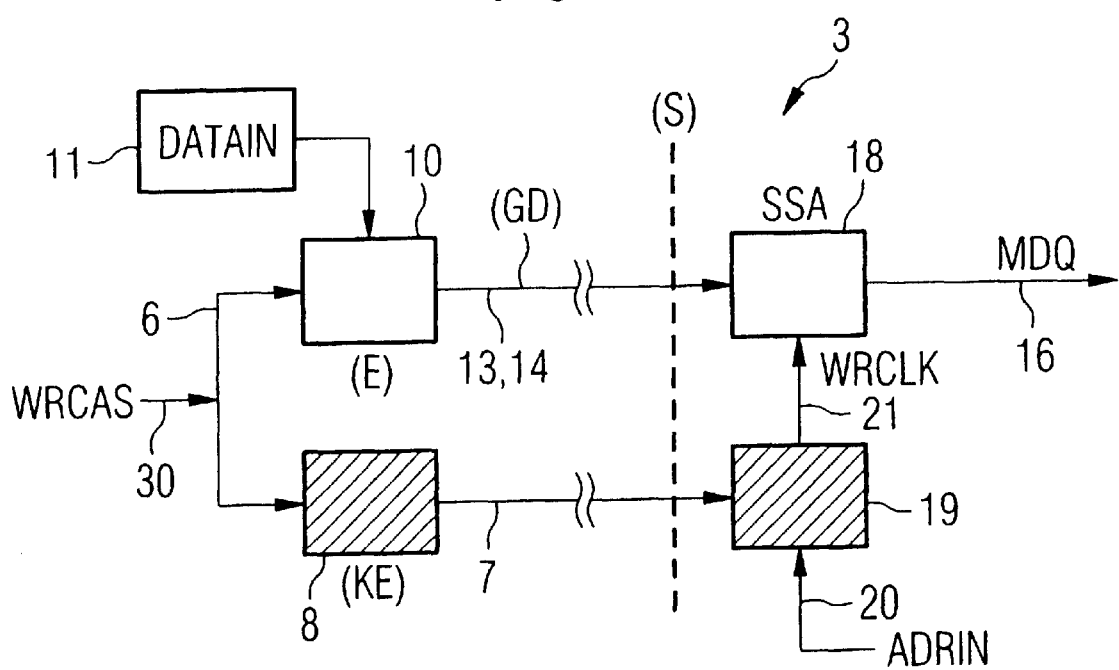
FIG. 2 is a block diagram showing the signal paths of a control signal and of data which pass through the control signal and the data during a write operation.

With reference to FIG. 2, there is shown a schematic overview of the signal paths of the control signal and of the data. The control signal is fed via the output 30 to the switching unit 10 and in parallel to the delay circuit 8. The line paths are constructed in such a way that the control signal is preferably fed simultaneously to the switching unit 10 and to the delay circuit 8. The switching unit 10 is connected to the input memory 11. In a simple embodiment, the switching unit 10 is embodied as a flip-flop, the first control line 6 being connected to a control input and the input memory 11 being connected to an input. After reception of the control signal, the flip-flop switches the connection of the input memory 11 to the output of the flip-flop which is connected to the output interface 13.

The delay circuit 8 is preferably of identical construction to the switching unit 10. The identity relates both to the components which bring about a delay of the switching operation of the switching unit 10 and to an identical technology used to construct components of the switching unit 10 and the components of the delay circuit 8. The output of the delay circuit 8 is connected to the second control line 7. Both the data bus 14 and the second control line 7 are connected to the column access controller 3. The data bus 14 is connected to a write amplifier 18. The column access controller 3 has, in addition to the write amplifier 18, a selection circuit 19 which is connected to the second control line 7 and to an address input 20. The selection circuit 19 has, as output, a third control line 21 which is connected to a control input of the write amplifier 18. If the selection circuit 19 receives a control signal and if a control signal is present simultaneously at the address input 20, a control signal is output to the write amplifier 18 via the third control line 21. If the write amplifier 18 receives a control signal via the control input, the write amplifier 18 reads the data present on the data bus 14 in and passes them on to the memory cells of the memory array 2 via the data line 16.

FIG. 3 shows the synchronization of the individual control signals in the form of a timing diagram. In the top line a) of the diagram, a write signal 31 is illustrated which is applied to the control unit 5 at the same time as a rising edge of the internal clock signal 22. The internal clock signal 22 is illustrated in a second line b) of the diagram. After this signal information has been detected, the control unit 5 outputs a control signal 23 via the output 30 two clock cycles later at the time T1. The control signal 23 is illustrated in a third line c) of the diagram. The control signal 23 is synchronous with the internal clock signal 22. In a fourth line d) of the diagram, a delayed control signal 24, such as is present at the column access controller 23, is illustrated. In a fifth line e) of the diagram, a data input signal 25 is illustrated which corresponds to the control signal at the input of the input/output circuit 9. If the data input signal 25 has a low level, the switching unit 10 is opened and there is no connection between the input memory 11 and the data bus 14. When there is a high signal of the data input signal 25, the switching unit 10 is closed and the input memory 11 is connected to the data bus 14. The data stored in the input memory 11 is/are transferred onto the data bus.

In a sixth line f) of the diagram, a data bus signal is illustrated which displays the occupation of the data bus 14 with correct data signals. If the data bus signal 26 has a low level, no correct signal levels are present on the data bus 14. If the data bus signal 26 exceeds a signal edge center at the time T2, correct data is present on the data bus 14.

In a seventh line g) of the diagram, a transfer signal 27 is illustrated. The transfer signal 27 shows with a low level that no data is transferred into the memory access controller 3. A high level of the transfer signal 27 shows the state wherein correct data has been transferred from the data bus 14 into the column access controller 3.

Two clock periods after the write signal, the data input signal 25 (DQS) which is fed to the input/output circuit 9 is generated. At the rising edge of the data input signal, data is read out via the output interface 3 and is applied to the column access controller 3 via the data bus 14 at the correct time, i.e. before the second clock period after the write signal at the time T2.

Owing to the delay of the control signal via the delay circuit 8 and the second control line 7, the delayed control signal 24 is not present at the column access controller 3 until the time T3. At the time T3, the data is connected to the data bus 14 in a stable state. This is indicated by a high level of the data bus signal 26. After the reception of the control signal, the data present on the data bus 14 is stored in the selected memory cells by the column access controller 3 by means of the write amplifier 18.

We claim:

1. A circuit configuration, comprising:
   a memory array;
   a memory access controller connected to said memory array;
   an input/output circuit connected to said memory access controller through a data bus;
   a control unit connected to said input/output circuit via a first control line and to said memory access controller via a second control line, said control unit outputting a control signal simultaneously to said input/output circuit and to said memory access controller; and
   a delay circuit connected in said second control line, said delay circuit delaying the control signal by a given delay time.

2. The circuit configuration according to claim 1, wherein said second control line and said data bus are constructed with a substantially identical length.

3. The circuit configuration according to claim 1, wherein said delay circuit includes a copy circuit effecting a delay of the control signal, said copy circuit is substantially identical in design to signal paths of said input/output circuit at least in components through which the control signal and the data in the input/output circuit pass, and which effect a delay between a time at which the control signal arrives at said input/output unit and a time at which data is output by said input/output unit upon receiving a control signal.

4. The circuit configuration according to claim 1, wherein the delay time is approximately the time which said input/output circuit takes, after receiving the control signal, to output data onto said data bus.

5. The circuit configuration according to claim 1, wherein said delay circuit is a flip-flop having an input connected through to an output.

6. The circuit configuration according to claim 3, wherein said copy circuit comprises a plurality of components corresponding to components of said input/output circuit defining signal paths thereof.

7. The circuit configuration according to claim 3, wherein said copy circuit is manufactured using a technology equalling a technology in which said input/output circuit is manufactured.

8. The circuit configuration according to claim 2, wherein said second control line and said data bus are identical in terms a technology used to produce said second control line and said data bus.

* * * * *